United States Patent
Ikeda et al.

(10) Patent No.: US 8,559,250 B2
(45) Date of Patent: Oct. 15, 2013

(54) SEMICONDUCTOR MEMORY DEVICE CAPABLE OF CORRECTING THE OFFSET VOLTAGE OF A SENSE AMPLIFIER

(75) Inventors: Hidetoshi Ikeda, Kanagawa (JP); Koichi Takeda, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/471,360

(22) Filed: May 14, 2012

(65) Prior Publication Data

US 2012/0314510 A1    Dec. 13, 2012

(30) Foreign Application Priority Data

Jun. 13, 2011    (JP) ................................. 2011-131107

(51) Int. Cl.
*G11C 7/08*    (2006.01)

(52) U.S. Cl.
USPC ............ 365/189.15; 365/189.05; 365/189.07; 365/189.08; 365/190; 365/196; 365/156; 365/203; 365/205; 365/210.11; 365/207

(58) Field of Classification Search
USPC ............... 365/156, 154, 203, 189.15, 189.05, 365/189.07, 189.08, 190, 196, 205, 210.11, 365/207
See application file for complete search history.

(56) References Cited

U.S. PATENT DOCUMENTS

| | | | | |
|---|---|---|---|---|
| 5,568,438 | A * | 10/1996 | Penchuk | ........................ 365/208 |
| 5,596,539 | A * | 1/1997 | Passow et al. | ............. 365/210.1 |
| 6,584,026 | B2 | 6/2003 | Kawasumi | |
| 7,477,560 | B2 | 1/2009 | Kawasumi | |
| 7,944,766 | B2 | 5/2011 | Senou | |
| 8,014,212 | B2 * | 9/2011 | Nagata | ..................... 365/189.03 |
| 2002/0024851 | A1 | 2/2002 | Kawasumi | |
| 2007/0242499 | A1 | 10/2007 | Kawasumi | |
| 2010/0067318 | A1 | 3/2010 | Senou | |

FOREIGN PATENT DOCUMENTS

| | | |
|---|---|---|
| JP | 2002-083497 A | 3/2002 |
| JP | 2007-280537 A | 10/2007 |
| JP | 2010-073249 A | 4/2010 |

\* cited by examiner

*Primary Examiner* — Andrew Q Tran
(74) *Attorney, Agent, or Firm* — McGinn IP Law Group, PLLC

(57) ABSTRACT

Provided is a semiconductor memory device including a plurality of memory cells arranged in a matrix, a plurality of word lines arranged corresponding to each row of the memory cells, a plurality of bit line pairs arranged corresponding to each column of the memory cells, a column selector that selects any of the plurality of bit line pairs based on a column selection signal and connects the selected bit line pair to a data line pair, a precharge circuit that precharges the data line pair, a sense amplifier that amplifies a potential difference of the data line pair, and a control circuit that controls current for driving the sense amplifier based on potentials of the data line pair after a lapse of a specified period from start of amplification of the potential difference of the precharged data line pair by the sense amplifier.

18 Claims, 16 Drawing Sheets

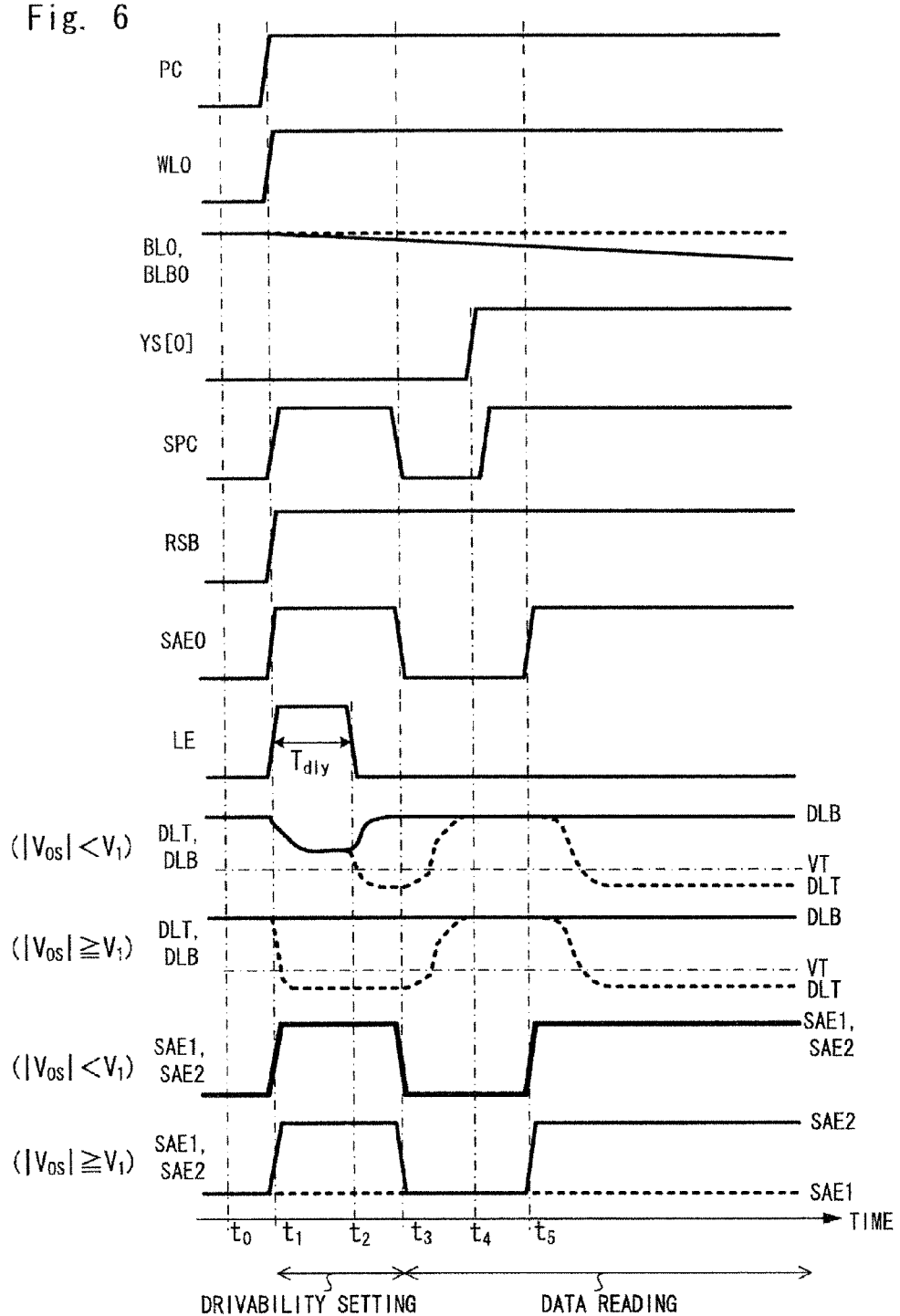

SEMICONDUCTOR MEMORY DEVICE CAPABLE OF CORRECTING THE OFFSET VOLTAGE OF A SENSE AMPLIFIER

CROSS-REFERENCE TO RELATED APPLICATIONS

This application is based upon and claims the benefit of priority from Japanese patent application No. 2011-131107, filed on Jun. 13, 2011, the disclosure of which is incorporated herein in its entirety by reference.

BACKGROUND

The present invention relates to a semiconductor memory device and a control method for the same.

With the progress towards finer design rules in CMOS process, variation in transistor characteristics is increasing. Particularly, because finer transistors are used for memory cells in SRAM (Static Random Access Memory), the effect of variation is significant. The increase in the variation of the characteristics of transistors constituting memory cells leads to a decrease in the yield of SRAM and a decrease in the operating speed of SRAM.

To address the above problem, it is effective to reduce the offset voltage of a sense amplifier, which is a component of SRAM. This is because reduction of the offset voltage allows reduction of bit line delay, which is a main cause of the decrease in the operating speed of SRAM. Note that the bit line delay is the time required until a potential difference of a bit line pair exceeds the offset voltage of a sense amplifier after a word line is activated in the case of reading data from a data read target memory cell.

A technique to reduce the offset voltage of a sense amplifier is disclosed in Japanese Unexamined Patent Application Publication No. 2010-73249. As shown in FIG. 12, the sense amplifier disclosed in Japanese Unexamined Patent Application Publication No. 2010-73249 includes a differential amplifier circuit 200 that generates an amplification signal according to a difference between a first input signal voltage BT and a second input signal voltage BB, an output circuit 201 that is connected to the differential amplifier circuit 200 and receives the amplification signal, and a load 202 that is connected to the differential amplifier circuit 200.

The differential amplifier circuit 200 includes a first output node N10 that supplies the amplification signal to the output circuit 201 and a second output node N20 that is placed at the position symmetric to the first output node N10 and connected to the load 202. The output circuit 201 has an output terminal that outputs an output signal generated based on the amplification signal.

Further, the load 202 is configured to switch between a first capacitance that makes an offset voltage at the output terminal a first voltage and a second capacitance that makes the offset voltage a second voltage. Thus, a systematic offset (center value) goes more negative than 0 mV when an offset adjustment signal adj is Disable, and the systematic offset goes more positive than 0 mV when the offset adjustment signal adj is Enable.

In a sense amplifier in which an offset voltage is negative than the systematic offset due to random variation, the offset voltage is brought back to the positive by setting the offset adjustment signal adj to Enable. The range of variation of the offset voltage is thereby reduced. By performing the same processing on each sense amplifier, the range of distribution of variation of the offset voltage is reduced as shown in FIG. 13.

As described above, in the technique disclosed in Japanese Unexamined Patent Application Publication No. 2010-73249, it is adjusted so that the systematic offset goes more negative than 0 mV when the offset adjustment signal adj is Disable. For example, it is adjusted so that the systematic offset is more negative than 0 mV by the amount of 30 mV when the offset adjustment signal adj is Disable. Therefore, the offset voltage of a sense amplifier whose offset voltage has been low before adjustment is also adjusted to be shifted to the negative by the amount of 30 mV. Thus, the technique disclosed in Japanese Unexamined Patent Application Publication No. 2010-73249 has a problem that the offset voltage of a sense amplifier with a low offset voltage increases.

A solution to the above problem is disclosed in Japanese Unexamined Patent Application Publication No. 2007-280537. As shown in FIGS. 14 and 15, a semiconductor integrated circuit device disclosed in Japanese Unexamined Patent Application Publication No. 2007-280537 includes two bit lines BL and BLB, input nodes IN1 and IN2, sense nodes S and SB that transmit amplification signals according to a difference between input signals input to the bit lines BL and BLB or the input nodes IN1 and IN2, an output node OUTB that outputs an amplification signal, current adjustment gates TG1 and TG2 that adjust the amount of current flowing through the sense nodes S and SB, latch circuits LC1 and LC2 that control the current adjustment gates, signal lines SL1 and SL2 that transmit a power supply voltage Vdd and a comparative voltage (Vdd−Voff), and switching elements SW1 and SW2 that are placed between the input nodes IN1 and IN2 and the signal lines SL1 and SL2.

In the case where the amplification signal is an inversion signal of a signal corresponding to a threshold voltage Voff when the power supply voltage Vdd and the comparative voltage (Vdd−Voff) are input to the input nodes IN1 and IN2, the latch circuits switch the current adjustment gates. The distribution of the offset voltage is thereby improved as shown in FIG. 16.

In the technique disclosed in Japanese Unexamined Patent Application Publication No. 2007-280537, only the sense amplifier SA with the offset voltage of the threshold voltage Voff or higher is selectively trimmed, which is different from the case of the technique disclosed in Japanese Unexamined Patent Application Publication No. 2010-73249.

SUMMARY

In the technique disclosed in Japanese Unexamined Patent Application Publication No. 2007-280537, in addition to the normal power supply voltage Vdd, an another power supply voltage (Vdd−Voff) that is lower than the power supply voltage Vdd by the voltage Voff is required. This raises a need to provide an additional power supply terminal, which makes it difficult to produce a design that satisfies design constraints.

As described above, according to the related techniques, there has been a problem that reduction of the offset voltage of a sense amplifier leads to difficulty in making a design that satisfies design constraints.

A first aspect of the present invention is a semiconductor memory device including a plurality of memory cells arranged in a matrix, a plurality of word lines arranged corresponding to each row of the memory cells, a plurality of bit line pairs arranged corresponding to each column of the memory cells, a column selector that selects any of the plurality of bit line pairs based on a column selection signal and connects the selected bit line pair to a data line pair, a precharge circuit that precharges the data line pair, sense amplifier that amplifies a potential difference of the data line pair, and a control circuit that controls current for driving the sense amplifier based on potentials of the data line pair after a lapse of a specified period from start of amplification of the potential difference of the precharged data line pair by the sense amplifier.

A second aspect of the present invention is a control method for a semiconductor memory device including a plurality of memory cells arranged in a matrix, a plurality of word lines arranged corresponding to each row of the memory cells, a plurality of bit line pairs arranged corresponding to each column of the memory cells, a column selector that selects any of the plurality of bit line pairs based on a column selection signal and connects the selected bit line pair to a data line pair, a precharge circuit that precharges the data line pair, a sense amplifier that amplifies a potential difference of the data line pair, and a control circuit that controls current for driving the sense amplifier, the method including precharging the data line pair to a specified potential by the precharge circuit, starting amplification of a potential difference of the precharged data line pair by the sense amplifier, detecting potentials of the data line pair after a lapse of a specified period from start of amplification of the potential difference of the data line pair by the sense amplifier by the control circuit, and controlling the current for driving the sense amplifier based on the potentials of the data line pair after a lapse of the specified period detected by the control circuit.

In the above-described circuit configuration, it is possible to reduce an offset voltage without causing difficulty in a design that satisfies design constraints.

According to the embodiment of the present invention, it is possible to provide a semiconductor memory device that can reduce an offset voltage without causing difficulty in a design that satisfies design constraints.

BRIEF DESCRIPTION OF THE DRAWINGS

The above and other aspects, advantages and features will be more apparent from the following description of certain embodiments taken in conjunction with the accompanying drawings, in which:

FIG. 6 is a timing chart showing an operation of the semiconductor memory device according to the first embodiment of the invention;

DETAILED DESCRIPTION

The first to fourth embodiments can be combined as desirable by one of ordinary skill in the art.

Embodiments of the present invention are described hereinafter with reference to the drawings. The drawings are given in simplified form by way of illustration only, and thus are not to be considered as limiting the present invention. The same elements are denoted by the same reference symbols, and the redundant explanation is omitted.

First Embodiment

Figure 1:
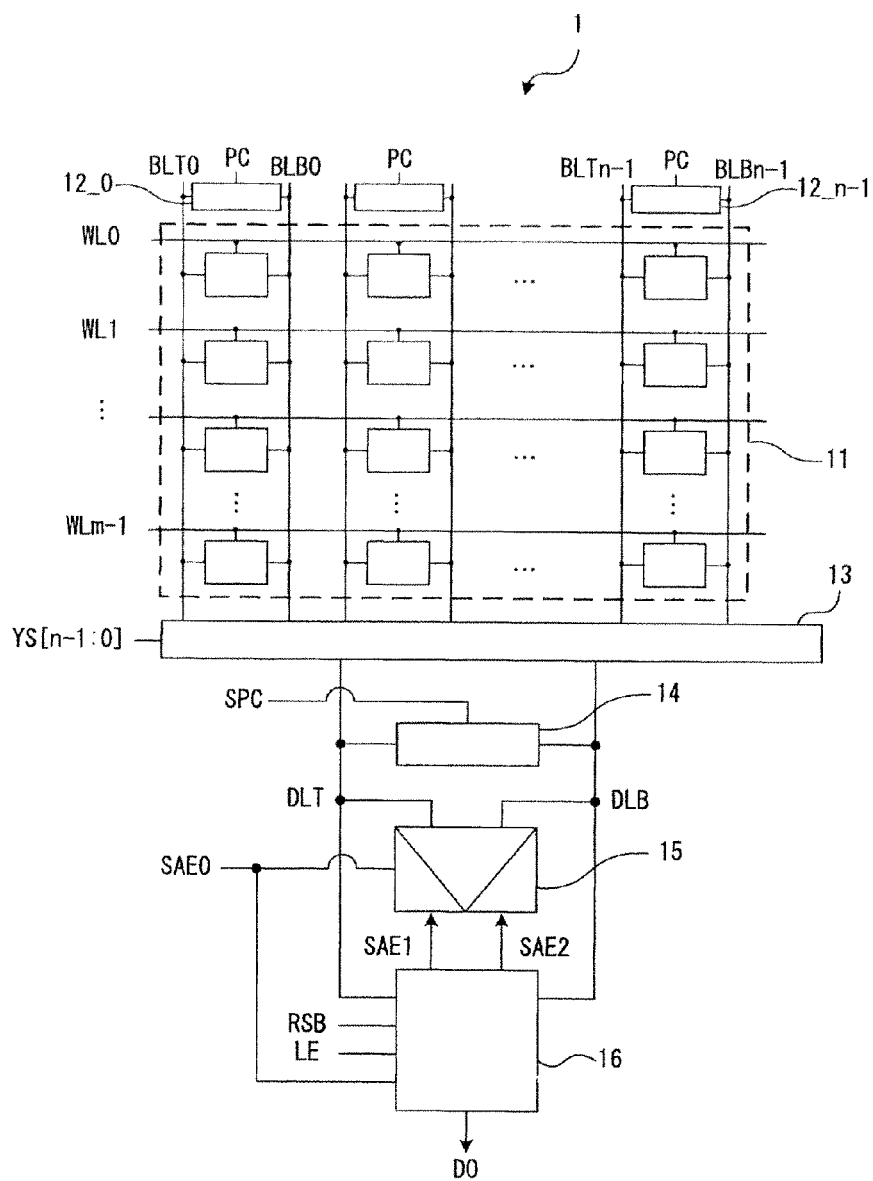
FIG. 1 is a block diagram showing a semiconductor memory device according to a first embodiment of the invention.

FIG. 1 is a block diagram showing a semiconductor memory device 1 according to a first embodiment of the invention. The semiconductor memory device 1 according to the embodiment has a feature of being able to reduce an offset voltage of a sense amplifier without causing difficulty in a design that satisfies design constraints. It is noted that, in the following description, a case where the semiconductor memory device 1 is SRAM is described by way of illustration.

Referring to FIG. 1, the semiconductor memory device 1 includes a memory cell array 11, precharge circuits 12_0 to 12_$n$−1 ($n$ is a natural number), a column selector 13, a precharge circuit 14, a sense amplifier circuit (sense amplifier) 15, and a control circuit 16.

The memory cell array 11 is composed of m×n number (m is a natural number) of memory cells arranged in a matrix. The memory cells arranged in the 0th row are connected to a word line WL0. Likewise, the memory cells arranged in the 1st to (m−1)th row are connected to word lines WL1 to WLm−1, respectively. Further, the memory cells arranged in the 0th column are connected to a bit line pair BLT0 and BLB0. Likewise, the memory cells arranged in the 1st to (n−1)th column are connected to bit line pairs BLT1 and BLB1 to BLTn−1 and BLBn−1, respectively.

The precharge circuits 12_0 to 12_$n$−1 are connected to the bit line pairs BLT0 and BLB0 to BLTn−1 and BLBn−1, respectively. The precharge circuits 12_0 to 12_$n$−1 precharge the bit line pairs BLT0 and BLB0 to BLTn−1 and BLBn−1, respectively, to a specified voltage according to a precharge signal PC. For example, the precharge circuits 12_0 to 12_n−1 precharge the bit line pairs BLT0 and BLB0 to BLTn−1 and BLBn−1, respectively, to H level (the voltage level of a power supply voltage VDD) when the precharge signal PC is L level (the voltage level of a ground voltage VSS).

The column selector 13 is connected to the bit line pairs BLT0 and BLB0 to BLTn−1 and BLBn−1. The column selector 13 selects any one pair of the bit line pairs BLT0 and BLB0 to BLTn−1 and BLBn−1 based on an n-bit column selection signal YS[n−1:0] and establishes continuity between the selected bit line pair and a data line pair DLT and DLB.

Whether the sense amplifier circuit 15 is enabled or not is controlled according to a sense amplifier enable signal SAE0. When enabled, the sense amplifier circuit 15 amplifies a potential difference of the data line pair DLT and DLB. A latch sense amplifier, for example, is used for the sense amplifier circuit 15.

The precharge circuit 14 is connected to the data line pair DLT and DLB. The precharge circuit 14 precharges the data line pair DLT and DLB to a specified voltage according to a precharge signal SPC. In other words, the precharge circuit 14 precharges input terminals IN and INB of the sense amplifier circuit 15 to a specified voltage according to the precharge signal SPC. For example, the precharge circuit 14 precharges the data line pair DLT and DLB to H level when the precharge signal SPC is L level.

The control circuit 16 outputs output data DO corresponding to the potentials of the data line pair DLT and DLB. Further, the control circuit 16 detects the potentials of the data line pair DLT and DLB after the lapse of a specified period from the start of amplification of the potential difference of the precharged data line pair DLT and DLB by the sense amplifier circuit 15, and outputs control signals SAE1 and SAE2 corresponding to the detection result. The potentials of the data line pair DLT and DLB after the lapse of the specified period include the potentials of the data line pair DLT and DLB that transitionally vary by the amplifying operation of the sense amplifier circuit 15. Note that a reset signal RSB, a detection result holding signal (holding signal) LE, and a sense amplifier enable signal SAE0 are input to the control circuit 16. The detail of the control circuit 16 is described later.

Figure 2:
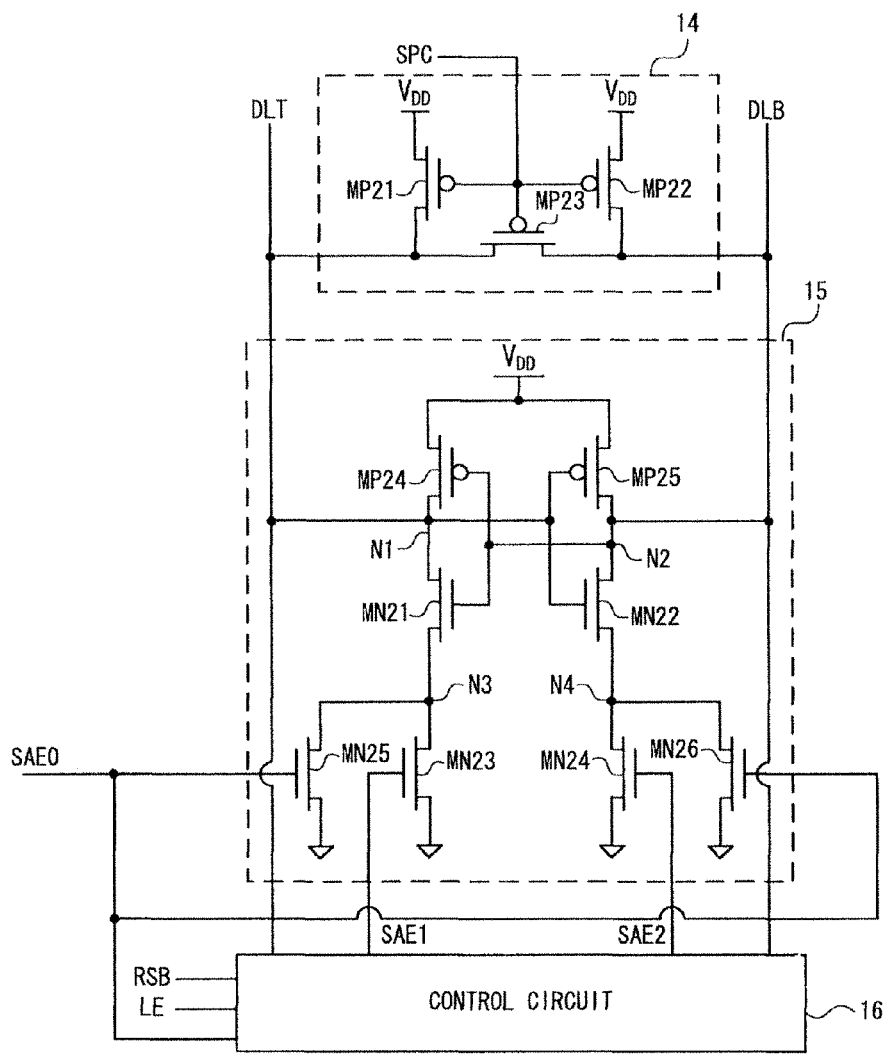
FIG. 2 is a diagram showing a specific configuration example of a sense amplifier circuit and a precharge circuit according to the first embodiment of the invention.

FIG. 2 is a diagram showing a specific configuration example of the precharge circuit 14 and the sense amplifier circuit 15.

The precharge circuit 14 includes transistors MP21 to MP23. In this embodiment, a case where the transistors MP21 to MP23 are p-channel MOS transistors is described by way of illustration.

The precharge signal SPC is applied to each gate of the transistors MP21 to MP23. The transistor MP21 is placed between a higher potential power supply terminal (first power supply terminal, which is referred to hereinafter as VDD) to which the power supply voltage VDD is supplied and the data line DLT. The transistor MP22 is placed between the higher potential power supply terminal VDD and the data line DLB. The transistor MP23 is placed between the data line DLT and the data line DLB.

When the precharge signal SPC is L level, all of the transistors MP21 to MP23 are ON. Both of the data line pair DLT and DLB are thereby precharged to H level.

The sense amplifier circuit 15 includes a transistor MP24, a transistor MP25, a transistor MN21, a transistor MN22, a transistor (first driving transistor) MN23, a transistor (second driving transistor) MN24, a transistor (third driving transistor) MN25, and a transistor (fourth driving transistor) MN26. In this embodiment, a case where the transistors MP24 and MP25 are p-channel MOS transistors and the transistors MN21 to MN26 are n-channel MOS transistors is described by way of illustration.

In the transistor MP24, a source is connected to the higher potential power supply terminal VDD, a drain is connected to a node N1, and a gate is connected to a node N2. In the transistor MP25, a source is connected to the higher potential power supply terminal VDD, a drain is connected to the node N2, and a gate is connected to the node N1. The node N1 is further connected to the data line DLT. The node N2 is further connected to the data line DLB.

In the transistor MN21, a source is connected to a node N3, a drain is connected to the node N1, and a gate is connected to the node N2. In the transistor MN22, a source is connected to a node N4, a drain is connected to the node N2, and a gate is connected to the node N1.

Thus, by cross connection of a first inverter composed of the transistors MP24 and MN21 and a second inverter composed of the transistors MP25 and MN22, a latch circuit is formed.

In the transistor MN23, a source is connected to a lower potential power supply terminal (second power supply terminal, which is referred to hereinafter as VSS) to which the ground voltage VSS is supplied, a drain is connected to the node N3, and the control signal SAE1 that is output from the control circuit 16 is applied to a gate. In the transistor MN24, a source is connected to the lower potential power supply terminal VSS, a drain is connected to the node N4, and the control signal SAE2 that is output from the control circuit 16 is applied to a gate.

In the transistor MN25, a source is connected to the lower potential power supply terminal VSS, a drain is connected to the node N3, and the sense amplifier enable signal SAE0 is applied to a gate. In the transistor MN26, a source is connected to the lower potential power supply terminal VSS, a drain is connected to the node N4, and the sense amplifier enable signal SAE0 is applied to a gate.

When the sense amplifier enable signal SAE0 is L level, the transistors MN25 and MN26 turn OFF. The control signals SAE1 and SAE2 at this time are L level (which is described later). The sources of the transistors MN21 and MN22 and the lower potential power supply terminal VSS thereby become non-continuous. Thus, the sense amplifier circuit 15 is disabled.

On the other hand, when the sense amplifier enable signal SAE0 is H level, the transistors MN25 and MN26 turn ON. The sources of the transistors MN21 and MN22 and the lower potential power supply terminal VSS thereby become continuous. Thus, the sense amplifier circuit 15 is enabled. At this time, the sense amplifier circuit 15 amplifies a potential difference of the nodes N1 and N2, which, the data line pair DLT and DLB.

Further, when the control signal SAE1 becomes H level in the case where the sense amplifier enable signal SAE0 is H level, the transistor MN23, in addition to the transistor MN25, turns ON. Therefore, the current (drain current) between the source and the drain of the transistor MN21 is higher than that when only the transistor MN25 is ON.

Likewise, when the control signal SAE2 becomes H level in the case where the sense amplifier enable signal SAE0 is H level, the transistor MN24, in addition to the transistor MN26, turns ON. Therefore, the current (drain current) between the source and the drain of the transistor MN22 is higher than that when only the transistor MN26 is ON.

Figure 3:
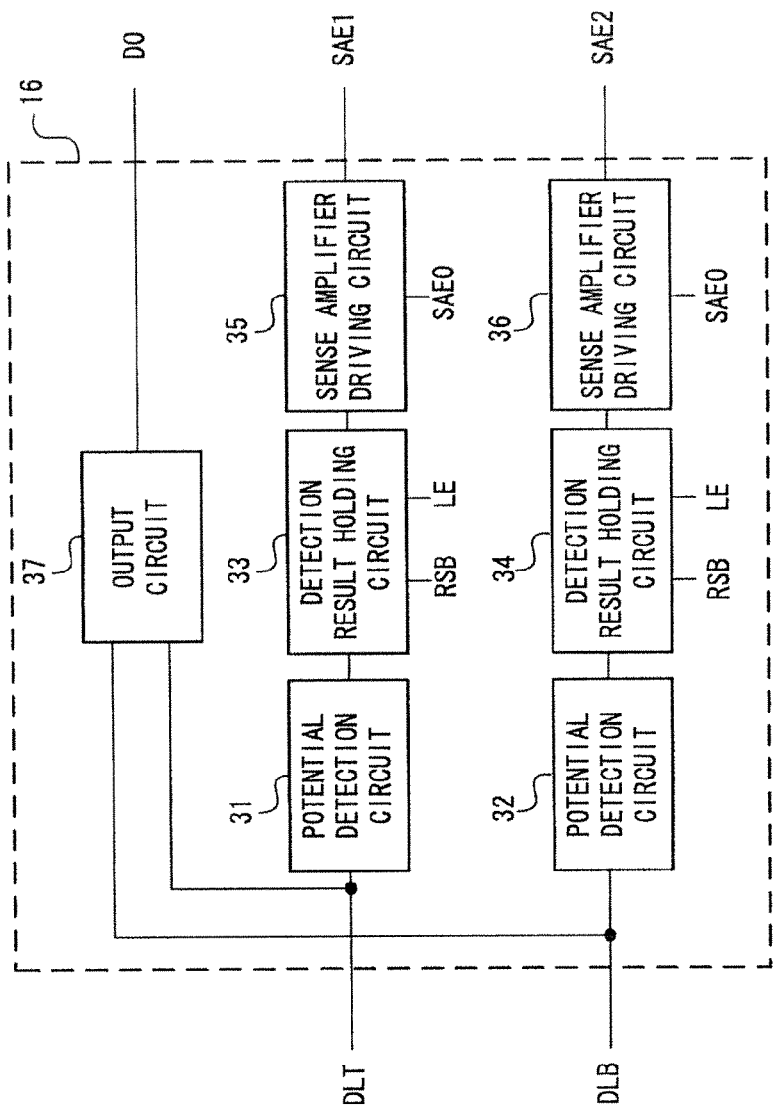
FIG. 3 is a block diagram showing a control circuit according to the first embodiment of the invention.

FIG. 3 is a block diagram showing the control circuit 16. The control circuit 16 includes potential detection circuits 31 and 32, detection result holding circuits (holding circuits) 33 and 34, sense amplifier driving circuits (driving circuits) 35 and 36, and an output circuit 37.

The output circuit 37 outputs the output data DO with a logical value corresponding to the potentials of the data line pair DLT and DLB. For example, when the potential of the data line DLT is higher than the potential of the data line DLB, the output circuit 37 outputs the output data DO with H level. On the other hand, when the potential of the data line DLT is lower than the potential of the data line DLB, the output circuit 37 outputs the output data DO with L level. Note that the output circuit 37 may be configured to output the output data DO corresponding to output results (detection results) of the potential detection circuits 31 and 32, instead of the potentials of the data line pair DLT and DLB.

The potential detection circuits 31 and 32 respectively detect whether the potentials of the data line pair DLT and DLB are a specified value or higher and outputs detection results. The detection result holding circuits 33 and 34 respectively hold the detection results from the potential detection circuits 31 and 32 in synchronization with the falling edge of the detection result holding signal LE.

Whether the sense amplifier driving circuits 35 and 36 are enabled or not is controlled according to the sense amplifier enable signal SAE0. When enabled, the sense amplifier driving circuits 35 and 36 respectively output the control signals SAE1 and SAE2 corresponding to the detection results held by the detection result holding circuits 33 and 34.

Figure 4:
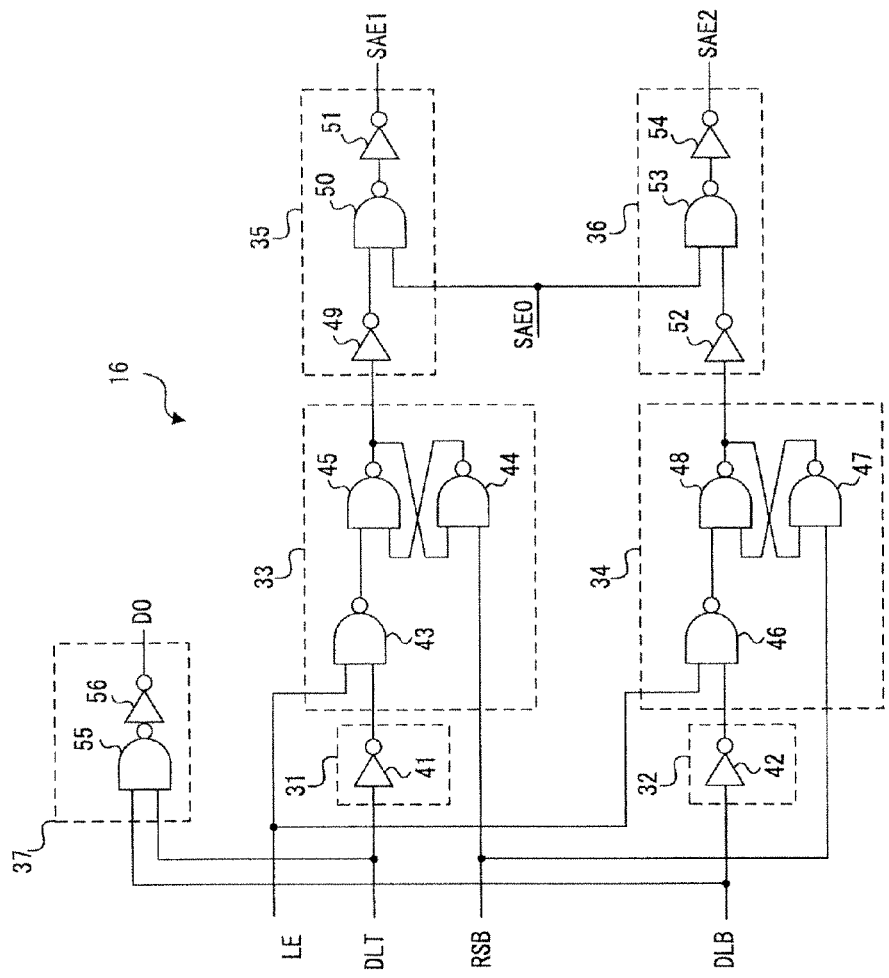
FIG. 4 is a diagram showing a specific configuration example of a control circuit according to the first embodiment of the invention.

FIG. 4 is a diagram showing a specific configuration example of the control circuit 16. As shown in FIG. 4, the potential detection circuit 31 includes an inverter (first inverter) 41. The potential detection circuit 32 includes an inverter (first inverter) 42. The detection result holding circuit 33 includes a NAND circuit (first NAND circuit, which is referred to hereinafter as NAND) 43, a NAND (second NAND circuit) 44, and a NAND (third NAND circuit) 45. The detection result holding circuit 34 includes a NAND circuit (first NAND circuit) 46, a NAND (second NAND circuit) 47, and a NAND (third NAND circuit) 48. The sense amplifier driving circuit 35 includes inverters 49 and 51 and a NAND 50. The sense amplifier driving circuit 36 includes inverters 52 and 54 and a NAND 53. The output circuit 37 includes a NAND 55 and an inverter 56.

In the potential detection circuit 31, the inverter 41 outputs a detection result of L level when the potential of the data line DLT is equal to or higher than a logical threshold voltage VT, and outputs a detection result of H level when the potential of the data line DLT is less than the logical threshold voltage VT. Note that, although the logical threshold voltage VT of the inverter 41 can be changed as appropriate, it is preferably equal to or lower than an intermediate value between the power supply voltage VDD and the ground voltage VSS ((VDD+VSS)/2). To be more specific, it is preferably about a voltage value 0.4×(VDD+VSS).

In the potential detection circuit 32, the inverter 42 outputs a detection result of L level when the potential of the data line DLB is equal to or higher than a logical threshold voltage VT, and outputs a detection result of H level when the potential of the data line DLB is less than the logical threshold voltage VT. Note that, although the logical threshold voltage VT of the inverter 42 can be changed as appropriate, it is preferably equal to or lower than an intermediate value between the power supply voltage VDD and the ground voltage VSS ((VDD+VSS)/2). To be more specific, it is preferably about a voltage value 0.4×(VDD+VSS).

In the detection result holding circuit 33, the NAND 43 outputs NAND of a detection result from the inverter 41 and the detection result holding signal LE. The NAND 44 outputs NAND of an output signal of the NAND 45 and the reset signal RSB. The NAND 45 outputs NAND of an output signal of the NAND 43 and an output signal of the NAND 44. In this manner, by cross connection of the NANDs 44 and 45, a latch circuit is formed. The detection result holding circuit 33 outputs an output signal of the NAND 45 to the sense amplifier driving circuit 35.

In this circuit configuration, the detection result holding circuit 33 outputs a signal of L level when the detection result holding signal LE and the reset signal RSB are both L level. Further, during the period where the detection result holding signal LE is H level when the reset signal RSB is H level, the detection result holding circuit 33 acquires a detection result of the potential detection circuit 31, and holds the detection result still after the detection result holding signal LE falls and outputs it.

In the detection result holding circuit 34, the NAND 46 outputs NAND of a detection result from the inverter 42 and the detection result holding signal LE. The NAND 47 outputs NAND of an output signal of the NAND 48 and the reset signal RSB. The NAND 48 outputs NAND of an output signal of the NAND 46 and an output signal of the NAND 47. In this manner, by cross connection of the NANDs 47 and 48, a latch circuit is formed. The detection result holding circuit 34 outputs an output signal of the NAND 48 to the sense amplifier driving circuit 36.

In this circuit configuration, the detection result holding circuit 34 outputs a signal of L level when the detection result holding signal LE and the reset signal RSB are both L level. Further, during the period where the detection result holding signal LE is H level when the reset signal RSB is H level, the detection result holding circuit 34 acquires a detection result of the potential detection circuit 32, and holds the detection result still after the detection result holding signal LE falls and outputs it.

In the sense amplifier driving circuit 35, the inverter 49 outputs a logical inversion of the output signal of the NAND 45. The NAND 50 outputs NAND of the output signal of the inverter 49 and the sense amplifier enable signal SAE0. The inverter 51 outputs a logical inversion of the output signal of the NAND 50 as the control signal SAE1. Thus, the sense amplifier driving circuit 35 always outputs the control signal SAE1 of L level when the sense amplifier enable signal SAE0 is L level, and outputs a logical inversion of the output signal of the detection result holding circuit 33 when the sense amplifier enable signal SAE0 is H level.

In the sense amplifier driving circuit 36, the inverter 52 outputs a logical inversion of the output signal of the NAND 48. The NAND 53 outputs NAND of the output signal of the inverter 52 and the sense amplifier enable signal SAE0. The inverter 54 outputs a logical inversion of the output signal of the NAND 53 as the control signal SAE2. Thus, the sense amplifier driving circuit 36 always outputs the control signal SAE2 of L level when the sense amplifier enable signal SAE0 is L level, and outputs a logical inversion of the output signal of the detection result holding circuit 34 when the sense amplifier enable signal SAE0 is H level.

Figure 5:
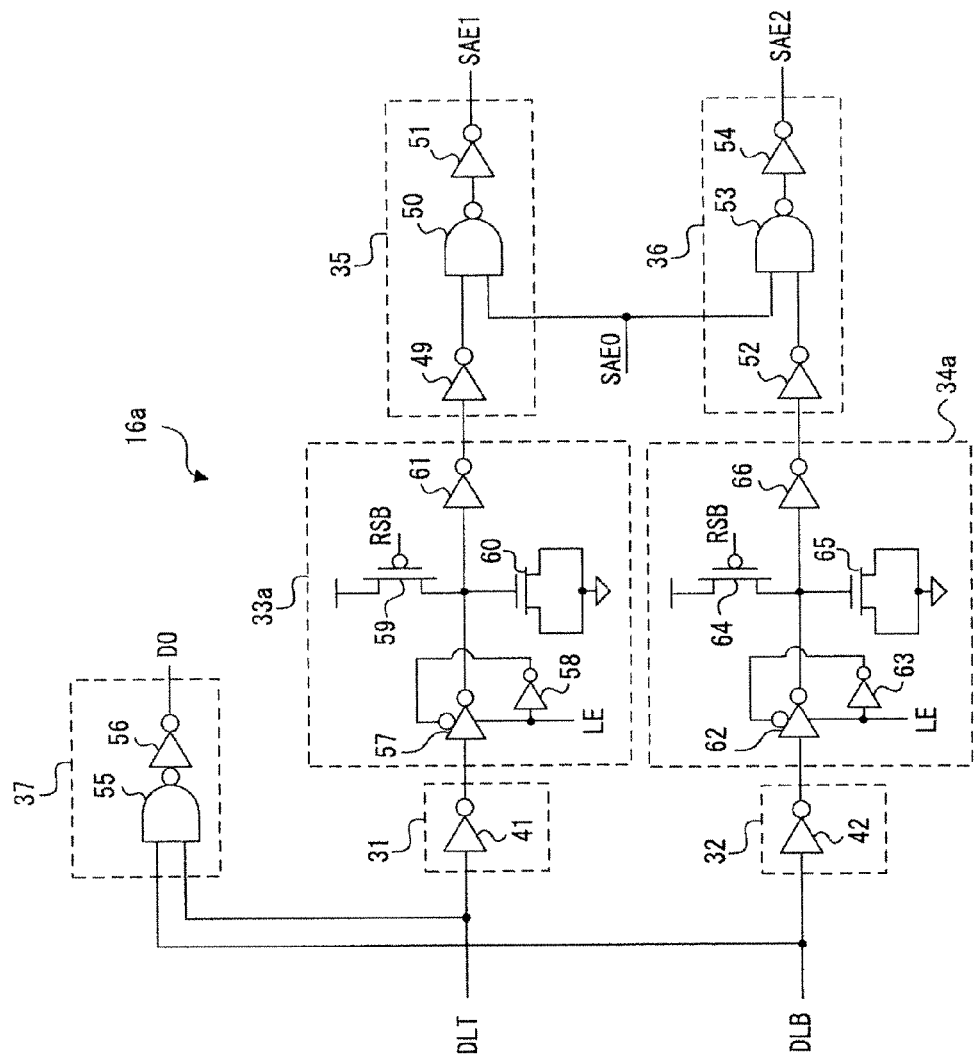
FIG. 5 is a diagram showing a specific configuration example of a control circuit according to the first embodiment of the invention.

FIG. 5 is a diagram showing another specific configuration example of the control circuit 16 as a control circuit 16a. As shown in FIG. 5, a detection result holding circuit 33a as an alternative to the detection result holding circuit 33 includes a tri-state inverter 57, an inverter 58, a p-channel MOS transistor (first transistor) 59, an n-channel MOS transistor (second transistor) 60, and an inverter (second inverter) 61. A detection result holding circuit 34a as an alternative to the detection result holding circuit 34 includes a tri-state inverter 62, an inverter 63, a p-channel MOS transistor (first transistor) 64, an n-channel MOS transistor (second transistor) 65, and an inverter (second inverter) 66.

In the detection result holding circuit 33a, the output state of the tri-state inverter 57 is controlled based on the detection result holding signal LE. Specifically, the tri-state inverter 57 puts the output into a high impedance state (HiZ) when the detection result holding signal LE is L level, and outputs a logical inversion of the detection result from the inverter 41 when the detection result holding signal LE is H level. The inverter 61 outputs a logical inversion of the voltage level of the output terminal of the tri-state inverter 57 to the sense amplifier driving circuit 35.

In the transistor 60, a source and a drain are connected to the lower potential power supply terminal VSS, and a gate is connected to a node between the tri-state inverter 57 and the inverter 61. Thus, the signal that is output from the tri-state inverter 57 when the detection result holding signal LE is H level is held by the gate capacitor of the transistor 60. Note that another capacitor element that can accumulate charges may be used in place of the transistor 60.

In the transistor 50, a source is connected to the higher potential power supply terminal VDD, a drain is connected to the node between the tri-state inverter 57 and the inverter 61, and the reset signal RSB is applied to a gate. When the reset signal RSB is L level, the transistor 59 turns ON, and therefore the inverter 61 outputs a signal of L level. Thus, the detection result holding circuit 33a is initialized by the reset signal RSB of L level.

In this circuit configuration, the detection result holding circuit 33a outputs a signal of L level when the detection result holding signal LE and the reset signal RSB are both L level. Further, during the period where the detection result holding signal LE is H level when the reset signal RSB is H level, the detection result holding circuit 33a acquires a detection result of the potential detection circuit 31, and holds the detection result still after the detection result holding signal LE falls and outputs it.

In the detection result holding circuit 34a, the output state of the tri-state inverter 62 is controlled based on the detection result holding signal LE. Specifically, the tri-state inverter 62 puts the output into a high impedance state (HiZ) when the detection result holding signal LE is L level, and outputs a logical inversion of the detection result from the inverter 42 when the detection result holding signal LE is H level. The inverter 66 outputs a logical inversion of the voltage level of the output terminal of the tri-state inverter 62 to the sense amplifier driving circuit 36.

In the transistor 65, a source and a drain are connected to the lower potential power supply terminal VSS, and a gate is connected to a node between the tri-state inverter 62 and the inverter 66. Thus, the signal that is output from the tri-state inverter 62 when the detection result holding signal LE is H level is held by the gate capacitor of the transistor 65. Note that another capacitor element that can accumulate charges may be used in place of the transistor 65.

In the transistor 64, a source is connected to the higher potential power supply terminal VDD, a drain is connected to the node between the tri-state inverter 62 and the inverter 66, and the reset signal RSB is applied to a gate. When the reset signal RSB is L level, the transistor 64 turns ON, and therefore the inverter 66 outputs a signal of L level. Thus, the detection result holding circuit 34a is initialized by the reset signal RSB of L level.

In this circuit configuration, the detection result holding circuit 34a outputs a signal of L level when the detection result holding signal LE and the reset signal RSB are both L level. Further, during the period where the detection result holding signal LE is H level when the reset signal RSB is H level, the detection result holding circuit 34a acquires a detection result of the potential detection circuit 32, and holds the detection result still after the detection result holding signal LE falls and outputs it.

The potential detection circuits 31 and 32, the sense amplifier driving circuits 35 and 36 and the output circuit 37 have the same circuit configurations as those of the control circuit 16 shown in FIG. 4 and thus are not repeatedly described.

The control circuit 16a shown in FIG. 5 includes a smaller number of transistors than the control circuit 16 shown in FIG. 4. Further, because the gate capacitor of the transistors 60 and 65 included in the control circuit 16a is charged in a data read cycle, the gate size of the transistors 60 and 65 can be small. Thus, the circuit size can be reduced when the semiconductor memory device 1 includes the control circuit 16a shown in FIG. 5 rather than the control circuit 16 shown in FIG. 4.

(Timing Chart)

The operation of the semiconductor memory device 1 according to this embodiment is described hereinafter with reference to FIG. 6. FIG. 6 is a timing chart showing the operation of the semiconductor memory device 1 according to the embodiment.

A data read operation in the semiconductor memory device 1 is performed in the sequence of "drivability setting" and "data reading". Note that "drivability setting" is an operation to determine the current for driving the sense amplifier circuit 15 based on the level of an offset voltage. "Data reading" is an operation to read data stored in a memory cell selected as a data read target. In this example, a case where data stored in a memory cell connected to the word line WL0 and the bit line pair BLT0 and BLB0 is described by way of illustration.

First, the "drivability setting" operation is described. The precharge signal PC indicates L level (time t0) firstly. Accordingly, the bit line pairs BLT0 and BLB0 to BLTn−1 and BLBn−1 are precharged to H level (the voltage level of the power supply voltage VDD) by the precharge circuits 12_0 to 12_n−1. At this time, the word lines WL0 to WLm−1 all indicate L level, and a memory cell to serve as a target of data reading is not selected.

Further, the column selection signal YS[n−1:0] indicates L level (time t0). Therefore, the column selector 13 does not select any of the bit line pairs BLT0 and BLB0 to BLTn−1 and BLBn−1. Thus, the bit line pairs BLT0 and BLB0 to BLTn−1 and BLBn−1 and the data line pair DLT and DLB are non-continuous.

Further, the precharge signal SPC indicates L level (time t0). Therefore, the data line pair DLT and DLB are precharged to H level by the precharge circuit 14. At this time, because the sense amplifier enable signal SAE0 is L level, the control circuit 16 outputs the control signals SAE1 and SAE2 of L level. In this manner, because the sense amplifier enable signal SAE0 and the control signals SAE1 and SAE2 are all L level, the sense amplifier circuit 15 does not amplify a potential difference of the data line pair DLT and DLB. Besides, the reset signal RSB indicates L level and the detection result holding signal LE indicates L level.

Then, when the precharge signal PC changes from L level to H level and the word line WL0 changes from L level to H level (time t1), a potential difference starts to appear between the bit line BLT0 and the bit line BLB0 according to data stored in the selected memory cell.

Further, the precharge signal SPC, the reset signal RSB, the sense amplifier enable signal SAE0, and the detection result holding signal LE also change from L level to H level (time t1). The sense amplifier circuit 15 is thereby enabled and starts to amplify a potential difference of the data line pair DLT and DLB. However, because the column selection signal YS[n−1:0] remains L level, the bit line pairs BLT0 and BLB0 to BLTn−1 and BLBn−1 and the data line pair DLT and DLB remain non-continuous.

The rate of amplification of a potential difference of the data line pair DLT and DLB by the sense amplifier circuit 15 varies depending on the level of an offset voltage Vos. Specifically, the rate of amplification of a potential difference of the data line pair DLT and DLB is higher as the offset voltage Vos is higher, and the rate of amplification of a potential difference of the data line pair DLT and DLB is lower as the offset voltage Vos is lower.

The detection result holding signal LE rises concurrently with the start of amplification of a potential difference of the precharged data line pair DLT and DLB by the sense amplifier circuit 15 (time t1) and falls after the lapse of a specified period (Tdly) (time t2).

The control circuit 16 detects whether the potentials of the data line pair DLT and DLB at the falling edge of the detection results holding signal LE (time t2) are the logical threshold voltage VT or higher and holds the detection results. Then, the control circuit 16 outputs the control signals SAE1 and SAE2 according to the detection results held.

Specifically, when the potentials of the data line pair DLT and DLB at the falling edge of the detection results holding signal LE are equal to or higher than the logical threshold voltage VT, the control circuit 16 outputs the control signals SAE1 and SAE2 of H level. On the other hand, when the potentials of the data line pair DLT and DLB at the falling edge of the detection results holding signal LE are lower than the logical threshold voltage VT, the control circuit 16 outputs the control signals SAE1 and SAE2 of L level.

For example, when the offset voltage Vos is within the allowable range, that is, when the absolute value of the offset voltage Vos is lower than an allowable voltage V1 (see |Vos|<V1 in FIG. 6), the rate of amplification of a potential difference of the data line pair DLT and DLB by the sense amplifier circuit 15 is relatively low. Therefore, the potentials of the data line pair DLT and DLB at the falling edge of the detection results holding signal LE (time t2) both indicate equal to or higher than the logical threshold voltage VT. In this case, the control circuit 16 outputs the control signals SAE1 and SAE2 of H level.

On the other hand, when the offset voltage Vos is outside the allowable range, that is, when the absolute value of the offset voltage Vos is equal to or higher than the allowable voltage V1 (see |Vos|≥V1 in FIG. 6), the rate of amplification of a potential difference of the data line pair DLT and DLB by the sense amplifier circuit 15 is relatively high. Therefore, either one of the potentials of the data line pair DLT and DLB is lower than the logical threshold voltage VT at the falling edge of the detection results holding signal LE (time t2). In this case, the control circuit 16 sets one of the control signals SAE1 and SAE2 which corresponds to the data line with the potential lower than the logical threshold voltage VT to L level and the other control signal to H level. For example, when only the potential of the data line DLT of the data line pair DLT and DLB is lower than the logical threshold voltage VT, the control circuit 16 outputs the control signal SAE1 of L level and outputs the control signal SAE2 of H level.

In this manner, the voltage levels of the control signals SAE1 and SAE2 are determined. The ON/OFF state of the transistors MN23 and MN24 is thereby determined, so that the current for driving the sense amplifier circuit 15 is determined. The drivability setting is thereby done.

Next, the "data reading" operation is described. When the "drivability setting" operation is completed, the sense amplifier enable signal SAE0 changes from H level to L level (time t3). The sense amplifier circuit 15 is thereby disabled. Further, the precharge signal SPC also changes from H level to L level (time t3). The data line pair DLT and DLB is thereby precharged to H level by the precharge circuit 14.

After the data line pair DLT and DLB are precharged to H level, the column selection signal YS[0] changes from L level to H level (time t4). The column selector 13 thereby selects the bit line pair BLT0 and BLB0 to establish continuity between the bit line pair BLT0 and BLB0 and the data line pair DLT and DLB, respectively. After that, the precharge signal SPC changes from L level to H level. The potentials of the bit line pair BLT0 and BLB0 are thereby transferred to the data line pair DLT and DLB, respectively. As a result, the data line pair DLT and DLB indicate the potentials of the bit line pair BLT0 and BLB0.

After that, the sense amplifier enable signal SAE0 changes from L level to H level (time t5). The sense amplifier circuit 15 is thereby enabled. At this time, the control circuit 16 outputs the control signals SAE1 and SAE2 corresponding to the detection results held.

Specifically, when the offset voltage Vos is within the allowable range, the control circuit 16 outputs the control signals SAE1 and SAE2 of H level. Consequently, both of the transistors MN23 and MN24 turn ON. In this case, a resistance value between the source of the transistor MN21 and the lower potential power supply terminal VSS and a resistance value between the source of the transistor MN22 and the lower potential power supply terminal VSS are substantially the same level, and correction of the offset voltage is not performed. In this manner, correction of the offset voltage is not performed when the offset voltage Vos is within the allowable range.

On the other hand, when the offset voltage Vos is outside the allowable range, the control circuit 16 sets one of the control signals SAE1 and SAE2 to L level and the other one to H level. Consequently, either one of the transistors MN23 and MN24 turns OFF, and the other one turns ON.

For example, when only the potential of the data line DLT of the data line pair DLT and DLB is lower than the logical threshold voltage VT in "drivability setting", the control circuit 16 outputs the control signal SAE1 of L level and outputs the control signal SAE2 of H level. Consequently, the transistor MN23 turns OFF and the transistor MN24 turns ON. In this case, a resistance value between the source of the transistor MN21 and the lower potential power supply terminal VSS is larger than a resistance value between the source of the transistor MN22 and the lower potential power supply terminal VSS. Accordingly, the current flowing between the source and the drain of the transistor MN21 decreases, and therefore a decrease in the current flowing between the source and the drain of the transistor MN22 due to the effect of the offset voltage is counterbalanced. As a result, the effective offset voltage is reduced. In this manner, correction of the offset voltage is performed when the offset voltage Vos is outside the allowable range.

The sense amplifier circuit 15 amplifies a potential difference of the data line pair DLT and DLB in the state where the above-described correction of the offset voltage is done. Then, the control circuit 16 outputs the output data DO with a logical value corresponding to the potentials of the data line pair DLT and DLB.

Figure 7A:
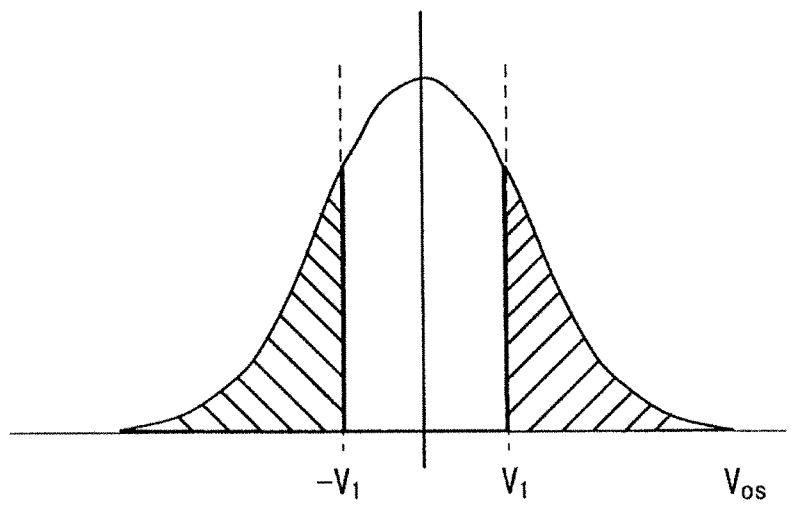
FIG. 7A is a diagram showing a distribution of an offset voltage before the present invention is applied.
Figure 7B:
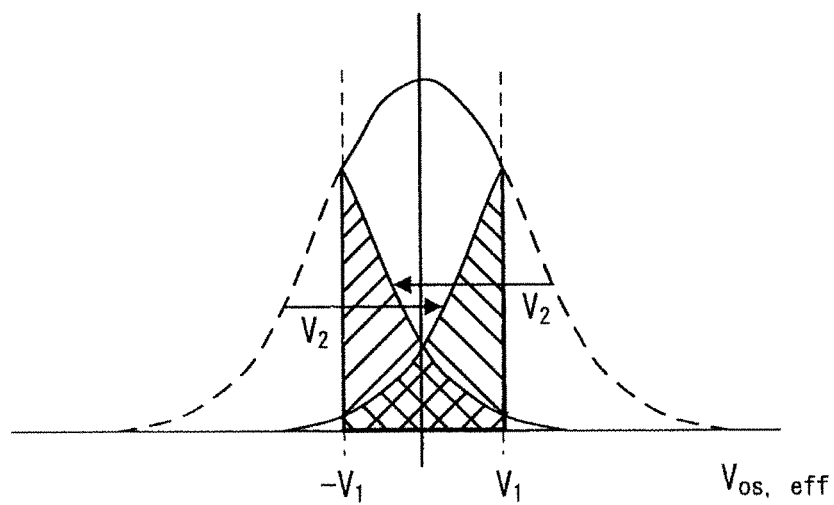
FIG. 7B is a diagram showing a distribution of an offset voltage before the present invention is applied.

FIGS. 7A and 7B are diagrams showing a distribution of an offset voltage before the present invention is applied and a distribution of an offset voltage after the present invention is applied, respectively. When the absolute value of the offset voltage Vos is equal to or higher than the allowable voltage V1 (the diagonally shaded areas in FIG. 7A), the offset voltage Vos is shifted into the allowable range (the diagonally shaded areas in FIG. 7B). In the example of FIG. 7B, the offset voltage Vos is shifted by the amount of a voltage V2. In this manner, according to the present invention, correction of the offset voltage is performed only for the sense amplifier circuit with a large offset voltage.

Note that the allowable voltage V1 is determined based on the specified period Tdly and the logical threshold voltage VT for the inverters 41 and 42. For example, it tends that the value of the allowable voltage V1 is smaller as the specified period Tdly is longer, and the value of the allowable voltage V1 is larger as the specified period Tdly is shorter. Further, it tends that the value of the allowable voltage V1 is smaller as the logical threshold voltage VT is higher, and the value of the allowable voltage V1 is larger as the logical threshold voltage VT is lower. The logical threshold voltage VT is preferably equal to or lower than an intermediate value between the power supply voltage VDD and the ground voltage VSS ((VDD+VSS)/2). To be more specific, it is preferably about a voltage value 0.4×(VDD+VSS).

Further, the shift amount (voltage V2) of the offset voltage is determined by the transistor size of the transistors MN23 to MN26 that constitute the sense amplifier circuit 15.

The operating speed of SRAM is typically determined by a combination of the offset voltage of the sense amplifier circuit in the worst case and the read cell current in the worst case. Thus, the operating speed of SRAM can be improved by performing correction of the offset voltage for the sense amplifier circuit with a large offset voltage.

As described above, the semiconductor memory device 1 according to this embodiment controls the current for driving the sense amplifier circuit 15 based on the potentials of the data line pair DLT and DLB after the lapse of the specified period Tdly from the start of amplification of a potential difference of the precharged data line pair DLT and DLB by the sense amplifier circuit 15. Thus, the semiconductor memory device 1 according to this embodiment, differently from the related art, does not need to use an additional power supply, and it is possible to reduce the offset voltage without causing difficulty in a design that satisfies design constraints.

Note that, in the case of the technique disclosed in Japanese Unexamined Patent Application Publication No. 2010-73249, it would appear that correction of the offset voltage is performed in the testing phase before shipment of LSI, not in sets with data reading. In this case, once correction of the offset voltage is done, correction cannot be made after that, and there is thus a problem of being unable to deal with the case where the offset voltage varies with temperature or varies with time. On the other hand, such a problem does not occur in the case of the embodiment of the present invention because correction of the offset voltage is performed in sets with data reading.

Further, in the case of the technique disclosed in Japanese Unexamined Patent Application Publication No. 2007-280537, a circuit for generating an additional power supply voltage may be placed inside instead of providing an additional power supply terminal. In this case, however, the circuit size increases. Particularly, in Japanese Unexamined Patent Application Publication No. 2007-280537, a difference between the normal power supply voltage Vdd and an additional power supply voltage (Vdd−Voff) is small, and it is required to generate the additional power supply voltage with high accuracy. It is considered that the circuit size of the circuit for generating the additional power supply voltage is larger as the accuracy is higher. On the other hand, because there is no need to use an additional power supply voltage in the case of the embodiment of the present invention, the offset voltage can be reduced without increasing the circuit size.

Second Embodiment

Figure 8:
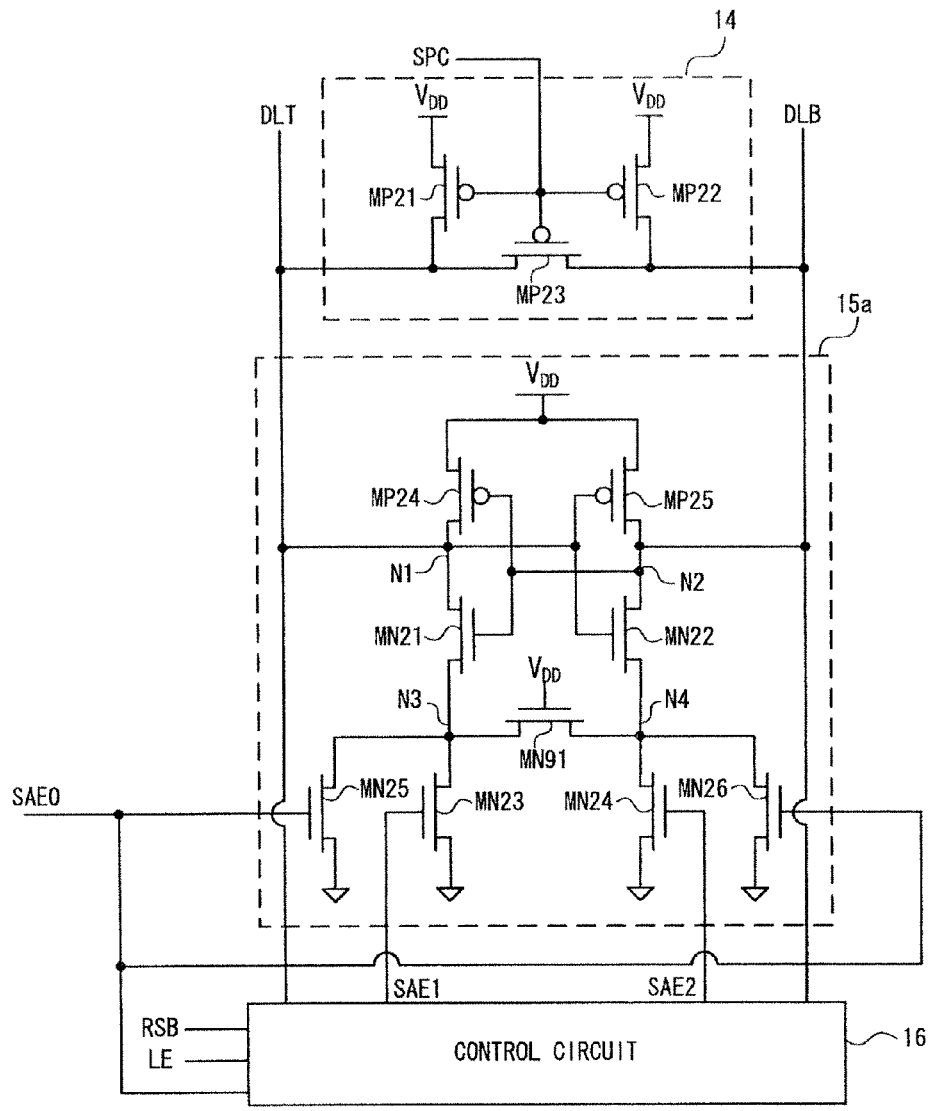
FIG. 8 is a diagram showing a specific configuration example of a sense amplifier circuit and a precharge circuit according to a second embodiment of the invention.

FIG. 8 is a diagram showing a part of a semiconductor memory device 1a according to a second embodiment of the invention. The semiconductor memory device 1a according to this embodiment includes a sense amplifier circuit 15a in which a transistor MN91 is added to the sense amplifier circuit 15, in place of the sense amplifier circuit 15. In this embodiment, a case where the transistor MN91 is an n-channel MOS transistor is described by way of illustration.

In the transistor MN91, a first terminal is connected to the node N3, a second terminal is connected to the node N4, and a gate (control terminal) is connected to the higher potential power supply terminal VDD. Thus, the transistor MN91 functions as a resistor element placed between the node N3 and the node N4. The other configuration of the semiconductor memory device 1a is the same as that of the semiconductor memory device 1 and not repeatedly described.

In the first embodiment, the source of the transistor MN21 and the source of the transistor MN22 are separated. On the other hand, in this embodiment, the source of the transistor MN21 and the source of the transistor MN22 are connected through the transistor MN91. It is thereby possible to improve the in-phase noise tolerance of the sense amplifier circuit 15a and improve the operation stability.

Although the case where the transistor MN91 is provided as a resistor element is described as an example in this embodiment, it is not limited thereto. Another element such as a polysilicon resistor may be used as a resistor element.

Third Embodiment

Figure 9:
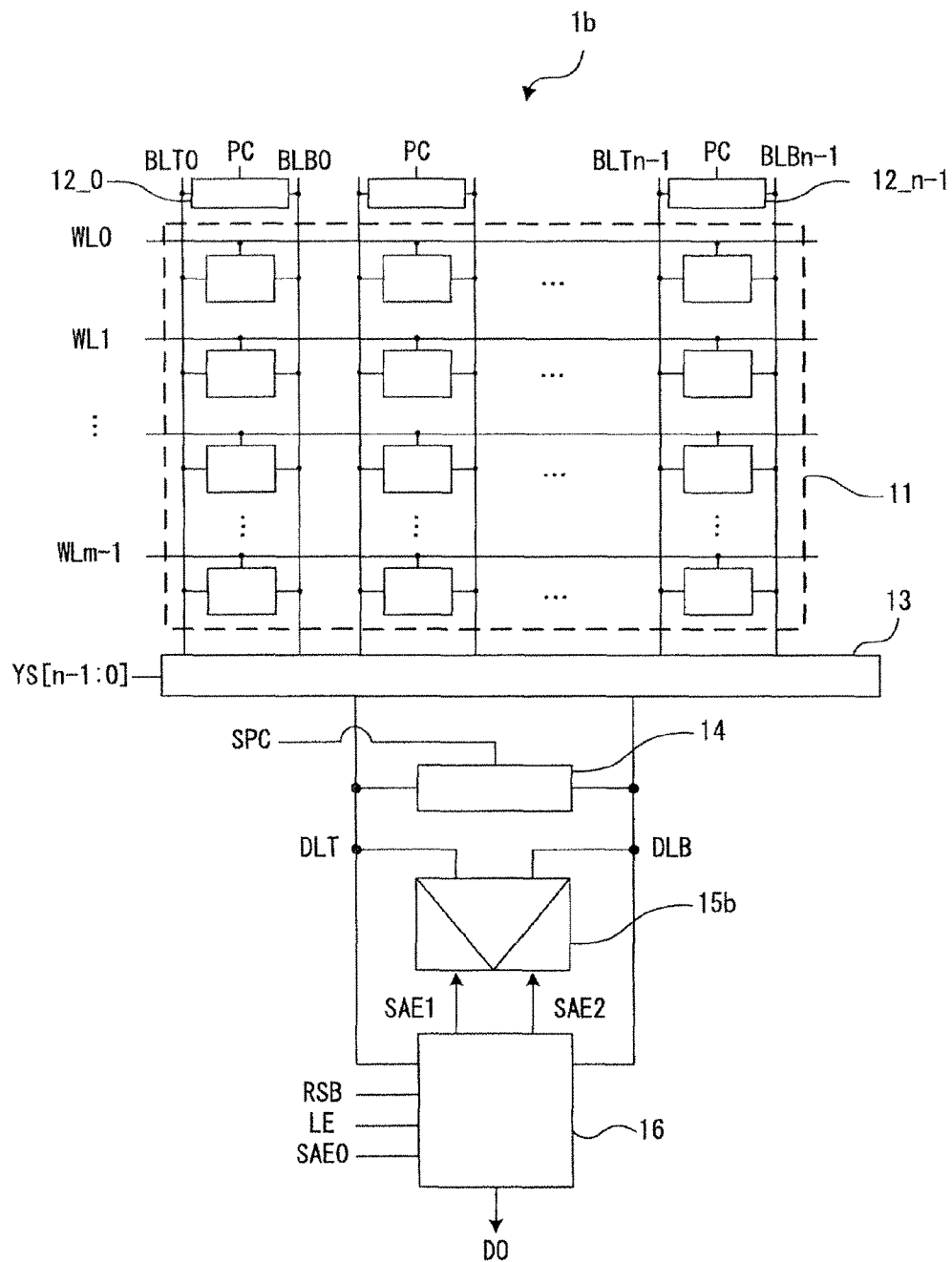
FIG. 9 is a block diagram showing a semiconductor memory device according to the second embodiment of the invention.

FIG. 9 is a block diagram showing a semiconductor memory device 1b according to a third embodiment of the invention. The semiconductor memory device 1b according to this embodiment includes a sense amplifier circuit 15b in place of the sense amplifier circuit 15a, compared with the semiconductor memory device 1a according to the second embodiment.

Figure 10:
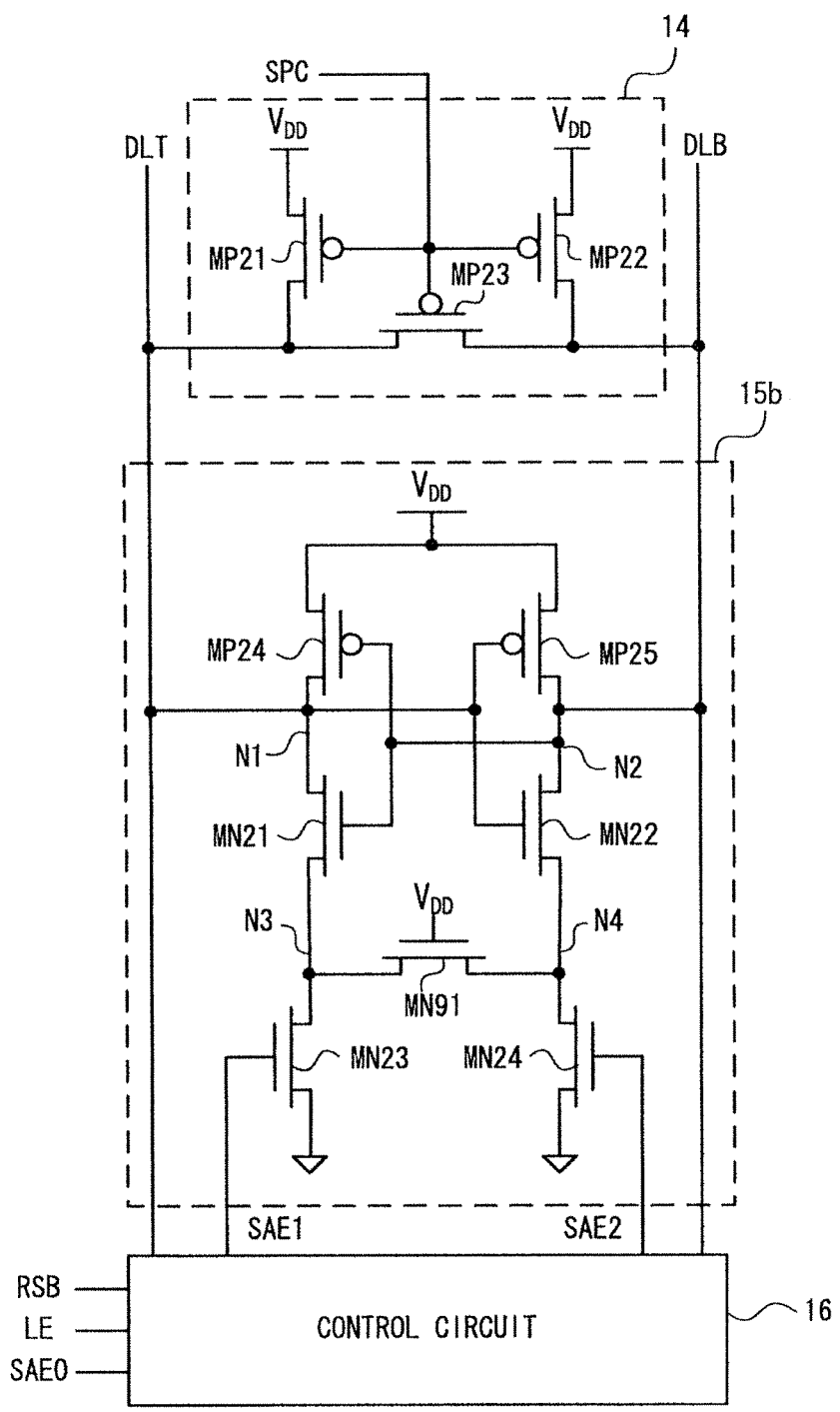
FIG. 10 is a diagram showing a specific configuration example of a sense amplifier circuit and a precharge circuit according to a third embodiment of the invention.

FIG. 10 is a diagram showing a specific configuration example of the sense amplifier circuit 15b and the precharge circuit 14. The sense amplifier circuit 15b includes transistors MN21 to MN24, transistors MP24 and MP25, and a transistor MN91. Thus, compared with the sense amplifier circuit 15a shown in FIG. 8, the sense amplifier circuit 15b does not include the transistors MN25 and MN26. The other configuration of the semiconductor memory device 1b is the same as that of the semiconductor memory device 1a and not repeatedly described.

Whether the sense amplifier circuit 15b is enabled or not is controlled by the control signals SAE1 and SAE2.

Specifically, when the sense amplifier enable signal SAE0 is L level, the control circuit 16 outputs the control signals SAE1 and SAE2 of L level. The transistors MN23 and MN24 thereby turn OFF, and the sources of the transistors MN21 and MN22 and the lower potential power supply terminal VSS become non-continuous. Thus, the sense amplifier circuit 15 is disabled. On the other hand, when the sense amplifier enable signal SAE0 is H level, the control circuit 16 sets at least one of the control signals SAE1 and SAE2 to H level. The sources of the transistors MN21 and MN22 and the lower potential power supply terminal VSS thereby become continuous. Thus, the sense amplifier circuit 15 is enabled.

In the "data reading" operation, when the offset voltage Vos is within the allowable range, that is, when the absolute value of the offset voltage Vos is lower than the allowable voltage V1, the control circuit 16 outputs the control signals SAE1 and SAE2 of H level. Consequently, both of the transistors MN23 and MN24 turn ON. In this case, a resistance value between the source of the transistor MN21 and the lower potential power supply terminal VSS and a resistance value between the source of the transistor MN22 and the lower potential power supply terminal VSS are substantially the same level, and correction of the offset voltage is not performed. In this manner, correction of the offset voltage is not performed when the offset voltage Vos is within the allowable range.

On the other hand, when the offset voltage Vos is outside the allowable range, that is, when the absolute value of the offset voltage Vos is equal to or higher than the allowable voltage V1, the control circuit 16 sets one of the control signals SAE1 and SAE2 to L level and the other one to H level. Consequently, either one of the transistors MN23 and MN24 turns OFF, and the other one turns ON. For example, when only the potential of the data line DLT of the data line pair DLT and DLB is lower than the logical threshold voltage VT in "drivability setting", the control circuit 16 outputs the control signal SAE1 of L level and outputs the control signal SAE2 of H level. Consequently, the transistor MN23 turns OFF and the transistor MN24 turns ON.

In this case, a resistance value between the source of the transistor MN21 and the lower potential power supply terminal VSS is mainly the sum of the on-resistances of the transistor MN91 and the transistor MN24. On the other hand, a resistance value between the source of the transistor MN22 and the lower potential power supply terminal VSS is mainly the on-resistance of the transistor MN24. Thus, a resistance value between the source of the transistor MN21 and the lower potential power supply terminal VSS is larger than a resistance value between the source of the transistor MN22 and the lower potential power supply terminal VSS. Accordingly, the current flowing between the source and the drain of the transistor MN21 decreases, and therefore a decrease in the current flowing between the source and the drain of the transistor MN22 due to the effect of the offset voltage is counterbalanced. As a result, the effective offset voltage is reduced. In this manner, correction of the offset voltage is performed when the offset voltage Vos is outside the allowable range.

As described above, the semiconductor memory device 1b according to this embodiment does not need to include the transistors MN25 and MN26, which allows further reduction of the circuit size.

Note that, although the case where when one of the transistors MN23 and MN24 is turns OFF, the transistor is completely OFF is described in this embodiment, it is not limited thereto. Changes in configuration may be made as appropriate so that when one of the transistors MN23 and MN24 is turns OFF, the transistor is not completely OFF and controlled to allow a slight flow of current. This prevents a resistance value between the transistor MN21, MN22 and the lower potential power supply terminal VSS from varying largely before and after correction of the offset voltage.

Fourth Embodiment

Figure 11:
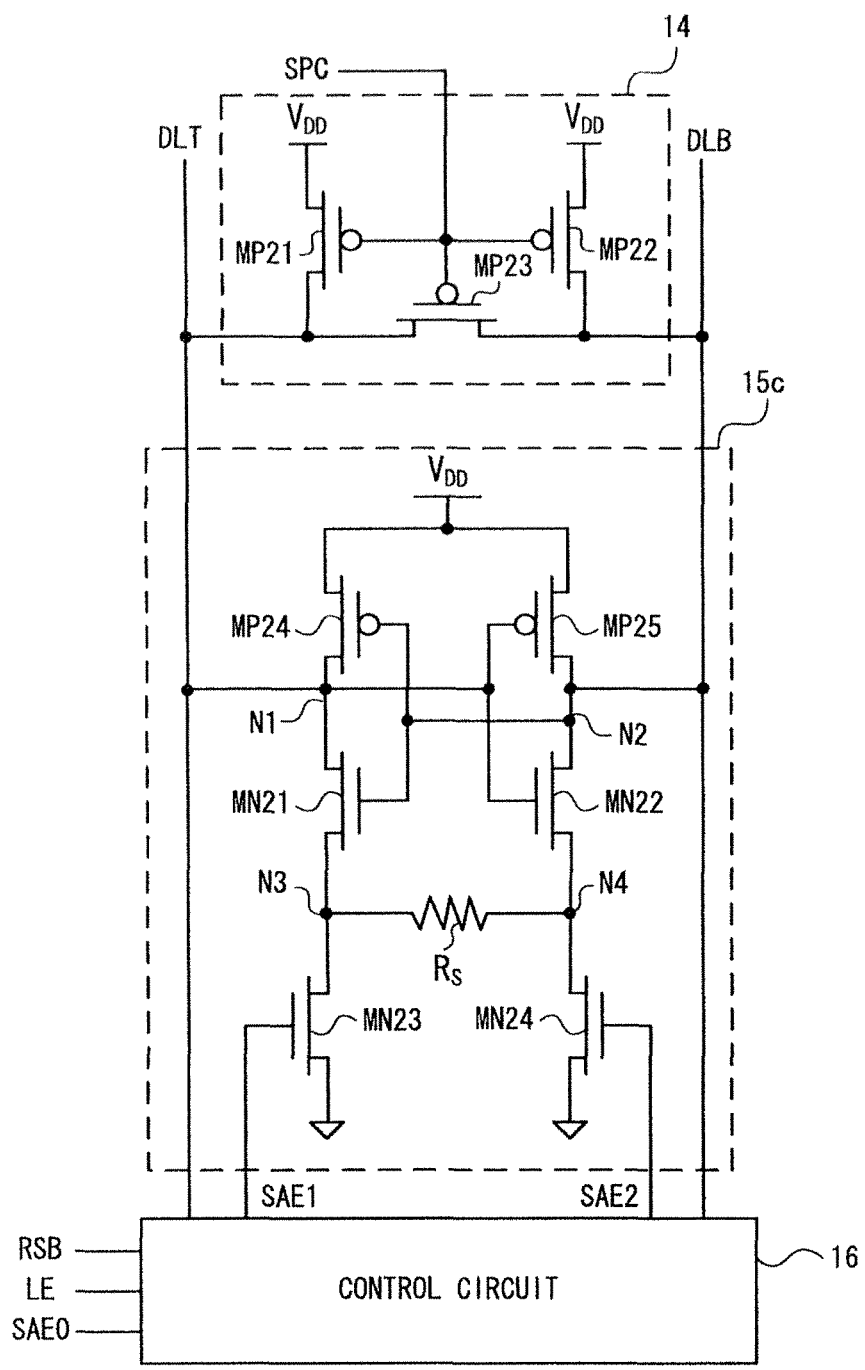
FIG. 11 is a diagram showing a specific configuration example of a sense amplifier circuit and a precharge circuit according to a fourth embodiment of the invention.
Figure 12:
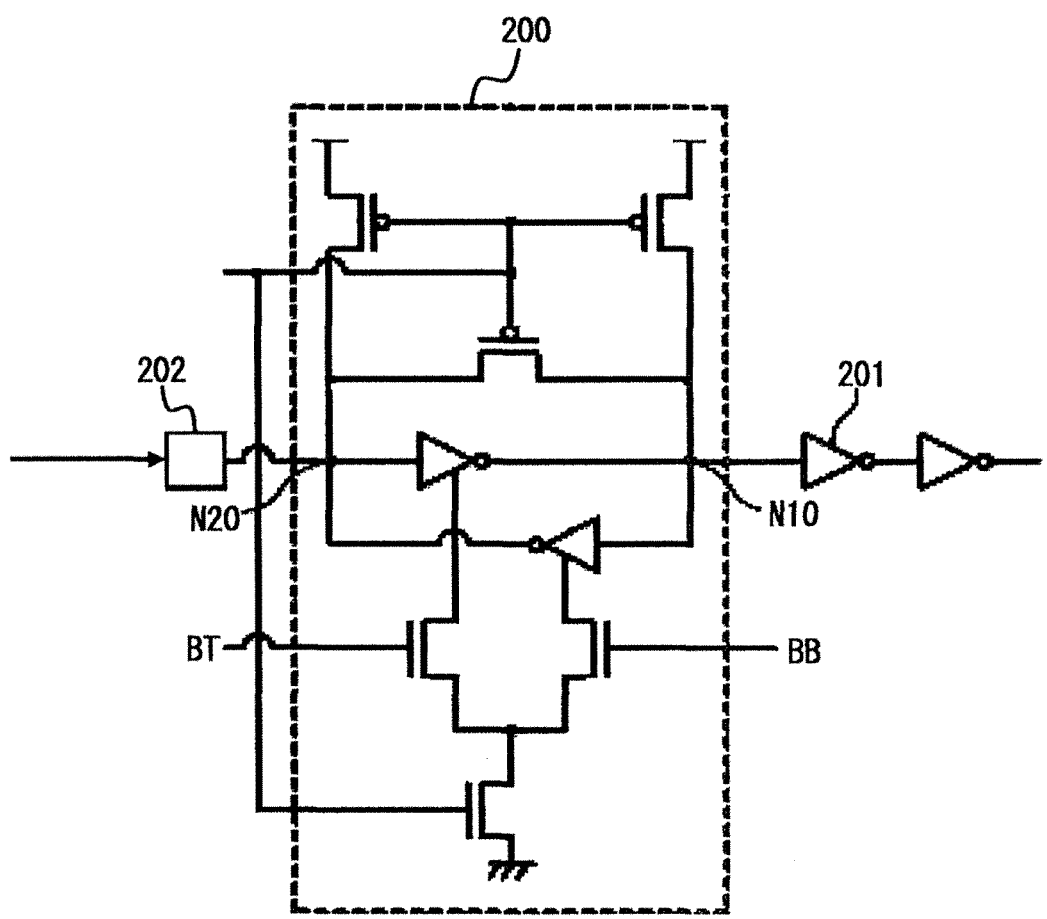
FIG. 12 is a diagram showing a sense amplifier disclosed in Japanese Unexamined Patent Application Publication No. 2010-73249.
Figure 13:
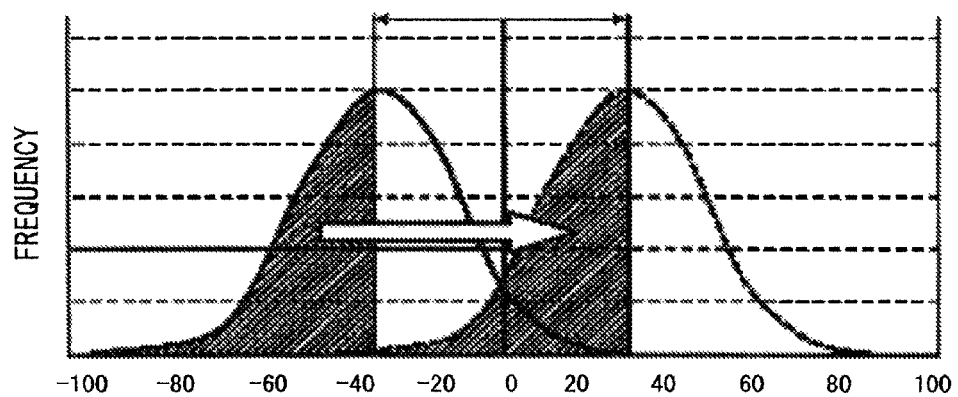
FIG. 13 is a diagram showing a distribution of an offset voltage before and after correction in Japanese Unexamined Patent Application Publication No. 2010-73249.
Figure 14:
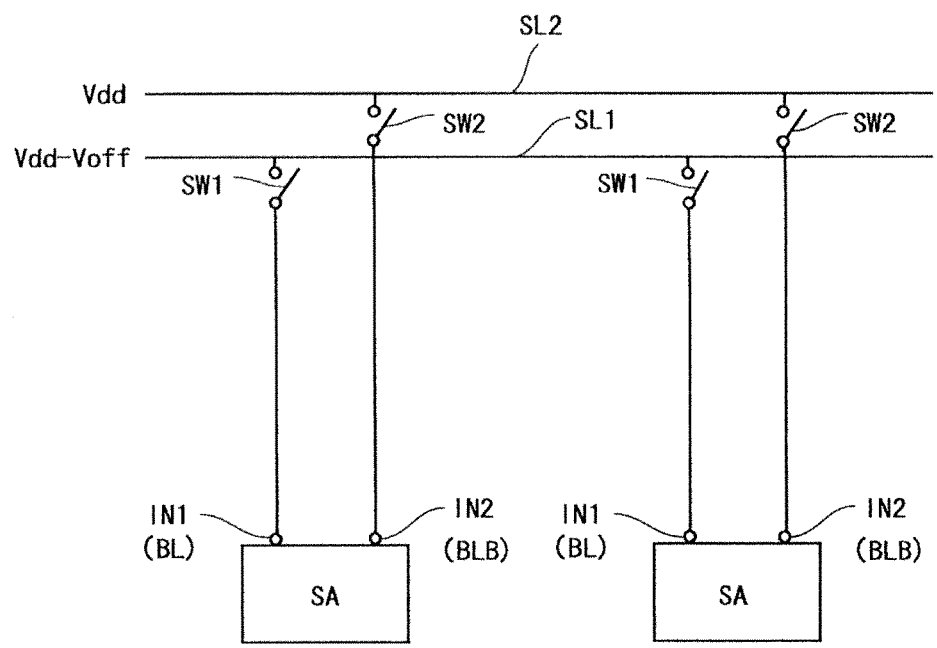
FIG. 14 is a diagram showing a semiconductor integrated circuit device disclosed in Japanese Unexamined Patent Application Publication No. 2007-280537.
Figure 15:
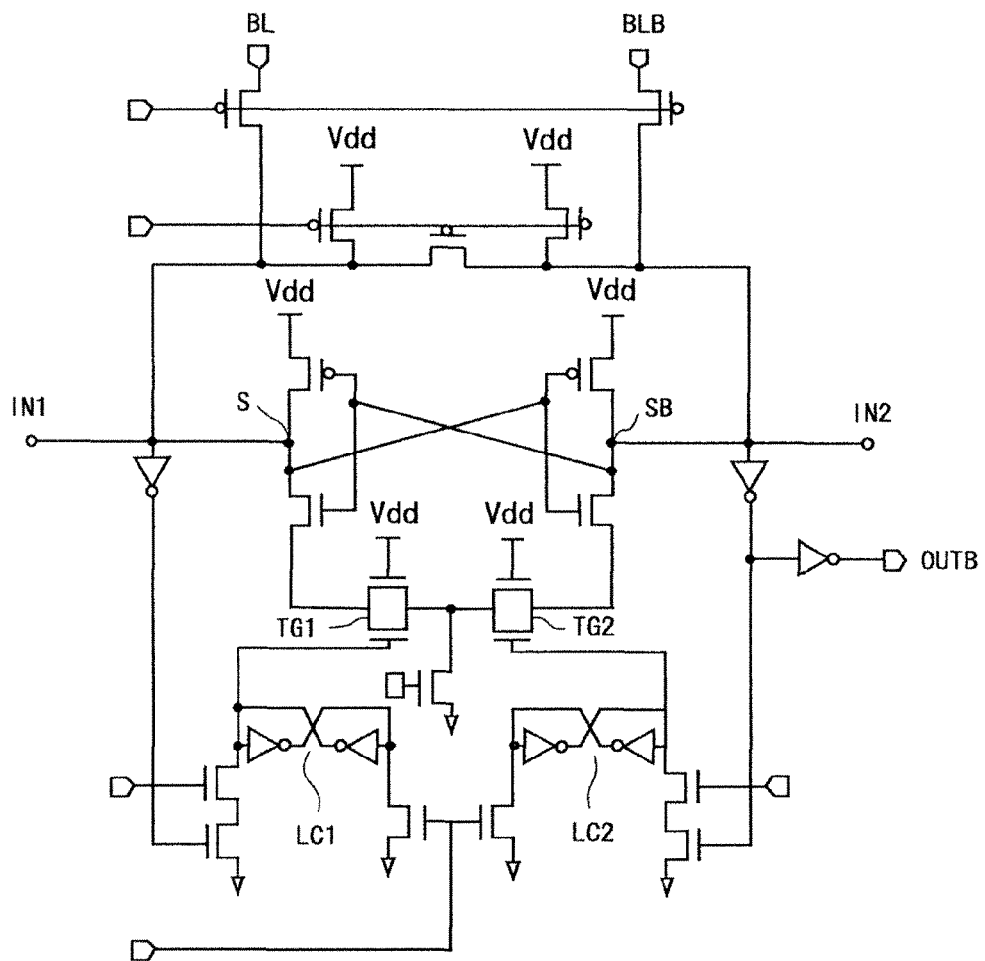
FIG. 15 is a diagram showing a semiconductor integrated circuit device disclosed in Japanese Unexamined Patent Application Publication No. 2007-280537.
Figure 16:
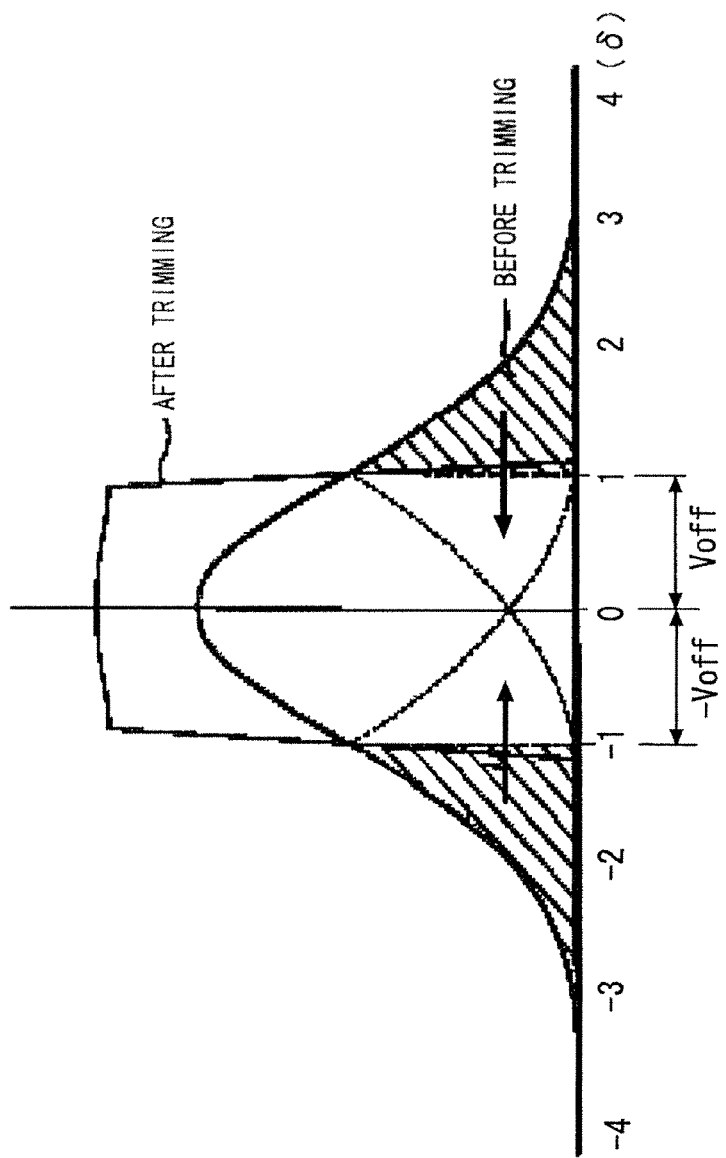
FIG. 16 is a diagram showing a distribution of an offset voltage before and after correction in Japanese Unexamined Patent Application Publication No. 2007-280537.

FIG. 11 is a diagram showing a part of a semiconductor memory device 1c according to a fourth embodiment of the invention. The semiconductor memory device 1c according to this embodiment includes a sense amplifier circuit 15c in place of the sense amplifier circuit 15b, compared with the semiconductor memory device 1b according to the third embodiment.

The sense amplifier circuit 15c includes a polysilicon resistor Rs in place of the transistor MN91, compared with the sense amplifier circuit 15b.

One terminal of the polysilicon resistor Rs is connected to the node N3, and the other terminal of the polysilicon resistor Rs is connected to the node N4. The other circuit configuration of the semiconductor memory device 1c is the same as that of the semiconductor memory device 1b and not repeatedly described.

In the case of using the polysilicon resistor Rs in place of the transistor MN91 also, the same effects as the third embodiment can be obtained.

Note that changes in configuration may be made as appropriate so that when one of the transistors MN23 and MN24 is turns OFF, the transistor is not completely OFF and controlled to allow a slight flow of current. This prevents a resistance value between the transistor MN21, MN22 and the lower potential power supply terminal VSS from varying largely before and after correction of the offset voltage.

Although the case where the polysilicon resistor Rs is provided as a resistor element is described as an example in this embodiment, it is not limited thereto. Another element may be used as a resistor element.

Note that, comparing the case of using the transistor MN91 as a resistor element as in the sense amplifier circuit 15b shown in FIG. 10 and the case of using the polysilicon resistor Rs as a resistor element as in the sense amplifier circuit 15c shown in FIG. 11, the circuit area is smaller when using the transistor MN91. However, to suppress the resistance value of the transistor MN91, the gate width of the transistor needs to be designed to be large, which limits the reduction of the circuit size.

In light of this, by including the transistors MN23 and MN24 as in the sense amplifier circuit 15a shown in FIG. 8, it is possible to reduce the circuit size without increasing the gate width of the transistor MN91.

In the sense amplifier circuit 15a shown in FIG. 8, there are four signal paths through the transistors MN23 to MN26 between the source of the transistor MN21 and the lower potential power supply terminal VSS. Further, there are four signal paths through the transistors MN23 to MN26 between the source of the transistor MN22 and the lower potential power supply terminal VSS.

When the sense amplifier circuit 15a is enabled, that is, when the sense amplifier enable signal SAE0 is H level, the transistors MN25 and MN26 are assuredly ON. At this time, the source of the transistor MN21 and the lower potential power supply terminal VSS are continuous through a signal path without through the transistor MN91. Further, the source of the transistor MN22 and the lower potential power supply terminal VSS are continuous through a signal path without through the transistor MN91. It is thus possible in the sense amplifier circuit 15a shown in FIG. 8 to prevent a resistance value between the transistor MN21, MN22 and the lower potential power supply terminal VSS from varying largely before and after correction of the offset voltage. In other words, the ratios of the drain current of the transistors MN21 and MN22 can be close to each other. In this case, because the value of the linear resistance of the transistor MN91 can be large, it is thus possible to reduce the circuit size without increasing the gate width of the transistor MN91.

As described above, the semiconductor memory devices according to the first to fourth embodiments control the current for driving the sense amplifier circuit based on the potentials of the data line pair DLT and DLB after the lapse of the specified period from the start of amplification of a potential difference of the precharged data line pair DLT and DLB by the sense amplifier circuit. Thus, the semiconductor memory devices according to the first to fourth embodiments, differently from the related art, do not need to use an additional power supply, and it is possible to reduce the offset voltage without causing difficulty in a design that satisfies design constraints.

Further, in the semiconductor memory devices according to the first to fourth embodiments, correction of the offset voltage is performed in sets with data reading, and it is possible to deal with the case where the offset voltage varies with temperature or varies with time.

Furthermore, because the semiconductor memory devices according to the first to fourth embodiments do not need to use an additional power supply and thus do not need to include a circuit for generating an additional power supply voltage, it is possible to reduce the offset voltage without increasing the circuit size.

It should be noted that the present invention is not restricted to the above-described embodiments, and various changes and modifications may be made without departing from the scope of the invention. Although the case where the control signals SAE1 and SAE2 indicate a binary value of either H level or L level and the transistors MN21 and MN22 are controlled to be completely ON or OFF is described as an example in the above-described embodiments, it is not limited thereto. Changes in configuration may be made as appropriate so that the control signals SAE1 and SAE2 are analog signals indicating arbitrary voltage levels and the drain current of the transistors MN21 and MN22 are controlled according to the voltage levels of the control signals SAE1 and SAE2, for example.

Further, the control circuit is not limited to the configuration shown in FIGS. 4 and 5, and it may be changed to another circuit configuration to achieve the same operation.

Further, although the case where the precharge circuit 14 precharges the data line pair DLT and DLB to H level is described as an example in the above-described embodiments, it is not limited thereto. Changes in configuration may be made as appropriate so that the precharge circuit 14 precharges the data line pair DLT and DLB to L level. In this case, it is necessary to change the logical threshold voltage VT of the potential detection circuit 31 and the like included in the control circuit 16.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor memory device comprising:
    a plurality of memory cells arranged in a matrix;
    a plurality of word lines arranged corresponding to each row of the memory cells;
    a plurality of bit line pairs arranged corresponding to each column of the memory cells;
    a column selector that selects any of the plurality of bit line pairs based on a column selection signal and connects the selected bit line pair to a data line pair;
    a precharge circuit that precharges the data line pair;
    a sense amplifier that amplifies a potential difference of the data line pair; and
    a control circuit that controls current for driving the sense amplifier based on potentials of the data line pair after a lapse of a specified period from start of amplification of the potential difference of the precharged data line pair by the sense amplifier.

2. The semiconductor memory device according to claim 1, wherein the potentials of the data line pair after a lapse of the specified period include potentials of the data line pair transitionally varying by amplifying operation of the sense amplifier.

3. The semiconductor memory device according to claim 1, wherein the control circuit controls the current for driving the sense amplifier based on whether the potentials of the data line pair after a lapse of the specified period reach a reference potential.

4. The semiconductor memory device according to claim 1, wherein the control circuit includes:
    a potential detection circuit that detects whether potentials of the data line pair reach a reference potential and outputs a detection result;
    a holding circuit that holds the detection result after a lapse of the specified period; and
    a driving circuit that outputs a control signal for controlling the current for driving the sense amplifier according to the detection result held by the holding circuit.

5. The semiconductor memory device according to claim 4, wherein
    the potential detection circuit is composed of a first inverter, and
    the reference potential is determined based on a logical threshold voltage of the first inverter.

6. The semiconductor memory device according to claim 4, wherein the holding circuit is a latch circuit that holds the detection result detected by the potential detection circuit in synchronization with a holding signal.

7. The semiconductor memory device according to claim 4, wherein the holding circuit includes:
    a first NAND circuit that outputs NAND of a holding signal and the detection result of the potential detection circuit;
    a third NAND circuit that outputs NAND of an output of the first NAND circuit and an output of a second NAND circuit; and
    the second NAND circuit that outputs NAND of an output of the third NAND circuit and a reset signal.

8. The semiconductor memory device according to claim 4, wherein the holding circuit includes:
    a tri-state inverter that is controlled to put an output into a high impedance state or output a logical inversion of the detection result of the potential detection circuit based on a holding signal;
    a second inverter that outputs a logical inversion of a potential at an output terminal of the tri-state inverter;
    a first transistor that is placed between a node between the tri-state inverter and the second inverter and a first power supply terminal, and controlled to turn ON or OFF based on a reset signal; and
    a capacitor element placed between the node and a second power supply terminal.

9. The semiconductor memory device according to claim 8, wherein the capacitor element is a second transistor with a source and a drain connected to the second power supply terminal and a gate connected to the node between the tri-state inverter and the second inverter.

10. The semiconductor memory device according to claim 1, wherein the sense amplifier includes:
- a third inverter with an input terminal connected to one data line and an output terminal connected to another data line, and placed between first and second power supply terminals;
- a fourth inverter with an input terminal connected to said another data line and an output terminal connected to said one data line, and placed between the first and second power supply terminals;
- a first driving transistor placed between the first inverter and the second power supply terminal and having continuity controlled based on a control signal output from the control circuit;
- a second driving transistor placed between the second inverter and the second power supply terminal and having continuity controlled based on the control signal; and
- a resistor element placed between the first and second driving transistors.

11. The semiconductor memory device according to claim 10, wherein the resistor element is a MOS transistor.

12. The semiconductor memory device according to claim 10, wherein the resistor element is a polysilicon resistor.

13. The semiconductor memory device according to claim 1, wherein the sense amplifier includes:
- a third inverter with an input terminal connected to one data line and an output terminal connected to another data line, and placed between first and second power supply terminals;
- a fourth inverter with an input terminal connected to said another data line and an output terminal connected to said one data line, and placed between the first and second power supply terminals;
- a first driving transistor placed between the first inverter and the second power supply terminal and having continuity controlled based on a control signal output from the control circuit;
- a second driving transistor placed between the second inverter and the second power supply terminal and having continuity controlled based on the control signal;
- a third driving transistor placed in parallel with the first driving transistor and having continuity controlled based on a sense amplifier enable signal; and
- a fourth driving transistor placed in parallel with the second driving transistor and having continuity controlled based on the sense amplifier enable signal.

14. The semiconductor memory device according to claim 13, further comprising:
- a resistor element placed between the first and second driving transistors.

15. The semiconductor memory device according to claim 14, wherein the resistor element is a MOS transistor.

16. The semiconductor memory device according to claim 14, wherein the resistor element is a polysilicon resistor.

17. A control method for a semiconductor memory device including
- a plurality of memory cells arranged in a matrix,
- a plurality of word lines arranged corresponding to each row of the memory cells,
- a plurality of bit line pairs arranged corresponding to each column of the memory cells,
- a column selector that selects any of the plurality of bit line pairs based on a column selection signal and connects the selected bit line pair to a data line pair,
- a precharge circuit that precharges the data line pair,
- a sense amplifier that amplifies a potential difference of the data line pair, and
- a control circuit that controls current for driving the sense amplifier, the method comprising:
- precharging the data line pair to a specified potential by the precharge circuit;
- starting amplification of a potential difference of the precharged data line pair by the sense amplifier;
- detecting potentials of the data line pair after a lapse of a specified period from start of amplification of the potential difference of the data line pair by the sense amplifier by the control circuit; and
- controlling the current for driving the sense amplifier based on the potentials of the data line pair after a lapse of the specified period detected by the control circuit.

18. The control method for a semiconductor memory device according to claim 17, wherein the potentials of the data line pair after a lapse of the specified period include potentials of the data line pair transitionally varying by amplifying operation of the sense amplifier.

* * * * *